(12) United States Patent
Crews et al.

(10) Patent No.: US 7,660,128 B2
(45) Date of Patent: Feb. 9, 2010

(54) APPARATUS FOR ELECTRICAL AND OPTICAL INTERCONNECTION

(75) Inventors: Darren S. Crews, Santa Clara, CA (US); Lee L. Xu, Cupertino, CA (US)

(73) Assignee: Emcore Corporation, Albuquerque, NM (US)

( * ) Notice: Subject to any disclaimer, the term of this patent is extended or adjusted under 35 U.S.C. 154(b) by 899 days.

(21) Appl. No.: 10/955,876

(22) Filed: Sep. 30, 2004

(65) Prior Publication Data

US 2006/0067064 A1    Mar. 30, 2006

(51) Int. Cl.
*H05K 1/18* (2006.01)

(52) U.S. Cl. .................. 361/761; 361/760; 361/733; 361/767; 361/785; 361/808; 439/78; 439/79; 439/55; 439/83

(58) Field of Classification Search .......... 361/761, 361/764, 743, 731, 733, 737, 760, 767, 783, 361/785, 786, 808; 385/14; 439/79, 78, 439/55, 83

See application file for complete search history.

(56) References Cited

U.S. PATENT DOCUMENTS

| | | | |
|---|---|---|---|
| 4,167,303 A | 9/1979 | Bowen et al. | 350/96.21 |
| 4,461,537 A | 7/1984 | Raymer, II et al. | 350/96.2 |
| 4,547,039 A | 10/1985 | Caron et al. | 350/96.2 |
| 4,611,887 A | 9/1986 | Glover et al. | 350/96.21 |
| 4,715,820 A * | 12/1987 | Andrews et al. | 439/59 |
| 4,772,081 A | 9/1988 | Borgos et al. | 350/96.2 |
| 4,787,706 A | 11/1988 | Cannon et al. | 385/59 |
| 4,798,440 A | 1/1989 | Hoffer et al. | 350/96.2 |
| 4,953,929 A | 9/1990 | Basista et al. | 350/96.2 |
| 4,969,924 A | 11/1990 | Suverison et al. | 350/96.2 |
| 4,986,625 A | 1/1991 | Yamada et al. | 350/96.2 |
| 4,992,055 A * | 2/1991 | Brummans et al. | 439/78 |
| 5,016,968 A | 5/1991 | Hammond et al. | 350/96.2 |
| 5,037,175 A | 8/1991 | Weber | 385/76 |
| 5,039,194 A | 8/1991 | Block et al. | 383/88 |

(Continued)

FOREIGN PATENT DOCUMENTS

DE    39 10 166    11/1990

(Continued)

OTHER PUBLICATIONS

International Search Report for PCT/US2005/035491 mailed Mar. 21, 2006.

(Continued)

*Primary Examiner*—Dean A. Reichard
*Assistant Examiner*—Hoa C Nguyen

(57) ABSTRACT

A circuit package includes a circuit substrate having a cutout portion defined therein, an interconnect electrically coupled to the circuit substrate and an active circuit component disposed off the circuit substrate within the cutout portion and electrically coupled to the interconnect. An optical circuit includes a lead frame and an optical component electrically coupled to the lead frame. The lead frame includes a first lead portion at a first level having an upper surface and a lower surface, and a second lead portion at a second level lower than the first level and electrically connected to the first lead portion. The lower surface of the first lead portion is arranged to electrically connect to a surface of a circuit substrate. The second lead portion includes an upper surface and a lower surface. The optical component is disposed on the upper surface of the second lead portion.

15 Claims, 8 Drawing Sheets

U.S. PATENT DOCUMENTS

| | | | | |
|---|---|---|---|---|
| 5,076,656 | A | | 12/1991 | Briggs et al. .................. 385/71 |
| 5,104,243 | A | | 4/1992 | Harding ....................... 385/84 |
| 5,123,071 | A | | 6/1992 | Mulholland et al. ........... 385/53 |
| 5,206,986 | A | * | 5/1993 | Arai et al. ..................... 29/840 |
| 5,214,731 | A | | 5/1993 | Chang et al. .................. 385/69 |
| 5,398,295 | A | | 3/1995 | Chang et al. .................. 385/58 |
| 5,414,790 | A | | 5/1995 | Lee et al. ..................... 385/139 |
| 5,450,046 | A | * | 9/1995 | Kosugi et al. ................ 333/246 |
| 5,557,504 | A | * | 9/1996 | Siegel et al. ................. 361/773 |
| 5,574,812 | A | | 11/1996 | Beier et al. .................... 385/78 |
| 5,578,796 | A | * | 11/1996 | Bhatt et al. ................... 174/260 |
| 5,613,025 | A | | 3/1997 | Grois et al. .................... 385/53 |
| D383,380 | S | | 9/1997 | Kempf et al. ................. D8/395 |
| 5,675,682 | A | | 10/1997 | De Marchi .................... 385/77 |
| 5,742,719 | A | | 4/1998 | Birnbaum .................... 385/70 |
| 5,748,821 | A | | 5/1998 | Schempp et al. ............. 385/76 |
| 5,937,125 | A | | 8/1999 | Creswick et al. ............. 385/88 |
| 6,201,704 | B1 | | 3/2001 | Poplawski et al. .......... 361/753 |
| 6,212,324 | B1 | | 4/2001 | Lin et al. .................... 385/136 |
| 6,220,873 | B1 | | 4/2001 | Samela et al. .............. 439/76.1 |
| 6,220,878 | B1 | | 4/2001 | Poplawski et al. .......... 439/92 |
| 6,227,721 | B1 | | 5/2001 | Naito et al. ................... 385/78 |
| 6,267,606 | B1 | | 7/2001 | Poplawski et al. .......... 439/92 |
| 6,409,392 | B1 | | 6/2002 | Lampert et al. .............. 385/56 |
| D467,553 | S | | 12/2002 | Cheng ....................... D13/154 |
| 6,592,266 | B1 | | 7/2003 | Hankins et al. ............... 385/53 |
| 6,607,400 | B1 | * | 8/2003 | Ko .............................. 439/581 |
| 6,666,694 | B1 | | 12/2003 | Daly et al. .................... 439/79 |
| 6,692,159 | B2 | | 2/2004 | Chiu et al. .................... 385/53 |
| 6,692,161 | B2 | | 2/2004 | Zaborsky et al. .............. 385/92 |
| 6,717,824 | B2 | * | 4/2004 | Miyajima et al. ........... 361/803 |
| 6,729,905 | B1 | | 5/2004 | Hwang ....................... 439/607 |
| 7,051,433 | B1 | * | 5/2006 | Kwong et al. ................. 29/852 |
| 2003/0053762 | A1 | | 3/2003 | Cheng et al. .................. 385/88 |
| 2003/0113071 | A1 | | 6/2003 | Kim et al. ..................... 385/76 |
| 2003/0113077 | A1 | | 6/2003 | Xu et al. ....................... 385/93 |
| 2003/0132026 | A1 | * | 7/2003 | Hwang Bo ................. 174/260 |
| 2003/0159280 | A1 | | 8/2003 | Young et al. .................. 29/840 |
| 2003/0169975 | A1 | | 9/2003 | Anderson et al. ............. 385/76 |
| 2004/0038563 | A1 | * | 2/2004 | Chin-Lung et al. ......... 439/76.1 |

FOREIGN PATENT DOCUMENTS

| | | |
|---|---|---|
| EP | 0 685 750 | 12/1995 |
| EP | 1 048 965 | 2/2000 |
| EP | 1 065 751 | 1/2001 |
| EP | 1 074 869 | 2/2001 |
| EP | 1 112 612 | 7/2001 |
| GB | 2 316 550 | 2/1998 |
| JP | 58 174916 | 1/1984 |
| JP | 2002 202434 | 7/2002 |
| WO | 03/096097 | 11/2003 |

OTHER PUBLICATIONS

Invitation to Pay Additional Fees—Partial International Search for PCT/US2005/031313 mailed Mar. 16, 2006.
Invitation to Pay Additional Fees—Partial International Search for PCT/US2005/035491 mailed Feb. 6, 2006.
Written Opinion for PCT/US2005/035491 mailed Mar. 21, 2006.
International Search Report and Written Opinion of the International Searching Authority for PCT/US2005/031313 dated Aug. 17, 2006.
International Preliminary Report on Patentability for International Application No. PCT/US2005/035491 dated Apr. 3, 2007.
Written Opinion of the International Searching Authority for International Application No. PCT/US2005/035491 dated Apr. 3, 2007.
Communication pursuant to Article 96(2) EPC for Application No. EP 05 809 065.5-1231, dated Jun. 20, 2007.
Intel TXN31015 4/2/1 Gbps Small Form Factor Optical Transceivers, Intel Corporation, 2004, ftp://download.intel.com/design/network/ProdBrf/30046302.pdf.
Configuration of Plastic Packages, National Semiconductor, 2003, www.national.com/quality/files/Package_Configuration_Plastic.pdf.
Intel TXN13600 10Gbps C-Band Tunable Optical Transceiver, 2004, http://www.intel.com/design/network/products/optical/phys/txn13600.htm.
Wiseman et al., "New Optical Packaging Required for 10-Gbit/sectransceiver Components," Lightwave, Oct. 2002, http://lightwave.articles.printthis.clicability.com/pt/cpt?action=cpt&title=New+optical+Package.
Intel TXN13220/1/5/7 Small Form Factor 10Gbps Optical Transceivers, 2004, http://www.intel.com/design/network/products/optical/phys/txn13220.htm.
Intel Technology Journal, Optical Technologies for Enterprise Networks, Intel Corporation, vol. 8, Issue 2, May 10, 2004.
Intel Technology Journal, 10Gb/s Optical Transceivers: Fundamentals and Emerging Technologies, Intel Corporation, vol. 8, Issue 2, May 10, 2004.
Intel TXN3101 4/2/1 Gbps Small Form Factor Optical Transceivers, Intel Corporation, 2004.
U.S. Appl. No. 10/954,880 entitled "Apparatus for an Electro-Optical Device Connection" filed Sep. 30, 2004.

* cited by examiner

APPARATUS FOR ELECTRICAL AND OPTICAL INTERCONNECTION

CROSS REFERENCE TO RELATED APPLICATION

This application is related to U.S. patent application Ser. No. 10/954,880 entitled "Apparatus for an Electro-optical Device Connection,", the contents of which are incorporated herein by reference in their entirety.

FIELD OF THE TECHNOLOGY

The present disclosure relates generally to circuit packages, and, more particularly, to interfacing optoelectronic devices with a printed circuit board.

BACKGROUND

Optoelectronic devices, such as optical receivers, optical transmitters and optical transceivers, for example, generally involve interconnection with a circuit substrate such as a printed circuit board (PCB). For example, an optoelectronic device was connected to a printed circuit board by mounting the optoelectronic device on the PCB. The optoelectronic device was interconnected with the PCB by surface mounting techniques, such as flip-chip mounting, through-hole mounting or wire bonding, for example. In each case, the optoelectronic device was mounted on a surface of the PCB.

A component to be mounted on a PCB, whether electronic or optoelectronic, was generally provided with a lead frame package. The lead frame package either included electrical leads or did not include electrical leads, depending on the intended mounting technique. A leadless lead frame package included solder bumps or solder plates on a surface of the component which made electrical contact with electrically conductive traces disposed on, or embedded, in the PCB. A lead frame package with leads included various lead frame structures, including J-bend leads, gull wing leads and through-hole leads. A J-bend lead extended from the side of the component and curved beneath the component. The J-bend lead raised the component above the surface of the PCB. A gull wing lead extended from the side of the component, and curved down and away from the component. The gull wing lead also raised the component above the PCB or allowed the component to rest on the PCB surface. A through-hole lead extended from below or from the side of the component and extended through electrical vias in the PCB. The through-hole lead raise the component above the PCB surface or allowed the component to rest on the PCB surface.

In many cases, the circuit package of the component and the PCB, such as those described above, limited the profile of the circuit package. For example, flat-panel displays, such as liquid crystal displays (LCDs), generally used components having a thin profile in order to decrease the overall profile of the display panel. Likewise, laptop computers were generally designed and manufactured to have a low profile. Although the PCB and the optical component were manufactured to have a thin profile, the profile of the overall circuit package was still limited. In turn, the profiles of the display panel or laptop computer were limited.

In some cases, a PCB included a cutout and a passive electrical connector was positioned in the cutout, thereby reducing the profile of the combination passive connector and PCB. The passive connector, which was sometimes a passive pluggable connector, provided an interface between the PCB and an interconnect such as a cable. However, active components, such as active electrical components and active optoelectronic components, for example, remained mounted on the surface of the PCB thereby increasing the overall profile of the circuit package.

DETAILED DESCRIPTION OF THE EXAMPLES

An example of a circuit package 10 having a low profile mounting technique is shown generally in FIGS. 1-5. Although the low profile mounting techniques are particularly well suited for interconnecting an optoelectronic device, with a printed circuit board (PCB), the teachings of the present application are not limited to any particular type of device. On the contrary, the teachings of the application may be employed with virtually any optical, electronic or optoelectronic devices interconnected with a printed circuit board or other circuit substrate. Thus, although the circuit package 10 will be described below primarily in relation to an optical receiver or optical transmitter interconnected with a printed circuit board for use in a flat panel display, the apparatus could likewise be used with other type of circuits, including, but not limited to, optical transceivers, optical front end (OFE) sub-assemblies, small form-factor optics, pluggable optics, and multi-source agreement (MSA) compliant optoelectronics, for example. In addition, although described primarily in relation to interconnecting a display driver of a display unit with a display controller of a base unit for a laptop computer, the circuit package 10 may be utilized for various apparatus that may incorporate components having a low profile.

Figure 1:
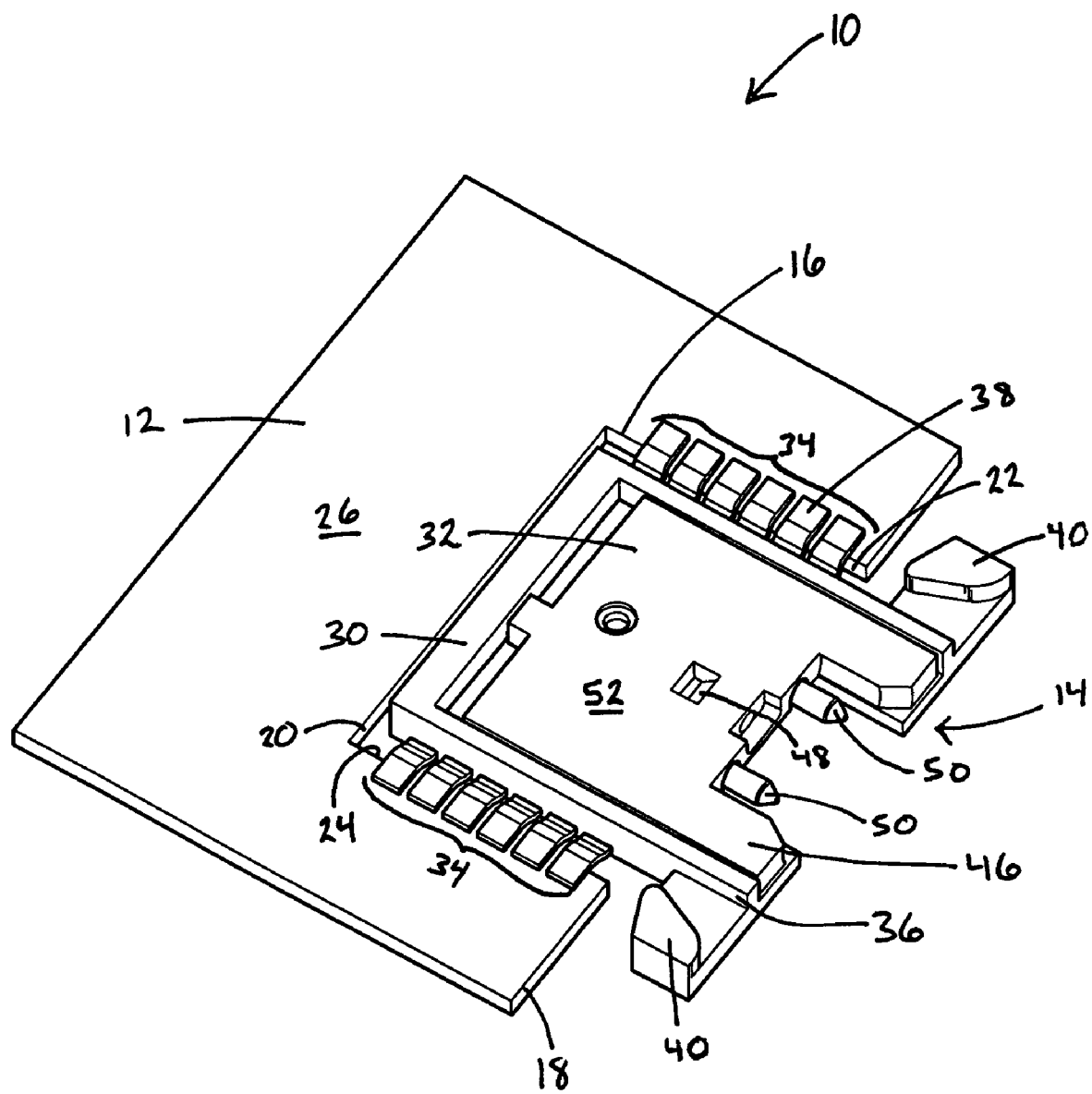
FIG. 1 is a top perspective view of a circuit package including an active circuit component mounted in a cutout of a circuit substrate.

Referring to FIG. 1, a circuit package 10 generally includes a base portion or circuit substrate 12 and an active circuit component 14. In one example, the circuit substrate 12 is a printed circuit board (PCB) which may include one or more electrically conductive traces used to communicatively couple the active circuit component 14 with additional circuits mounted on, or otherwise operatively coupled to, the PCB. In one example, the circuit substrate 12 may include any optical-electrical interface and may include any circuit that interfaces with an optical plane. The circuit substrate 12 may be, but is not limited to, a flam retardant (FR) laminate such as woven glass reinforced epoxy resin (FR4), a ceramic substrate such as an alumina substrate, an aluminum nitride (AlN) substrate or a silicon substrate. Although not shown in FIG. 1, the circuit substrate 12 may include additional components as may be found with various devices such as display drivers and display controllers, including processors, memory, integrated circuits (IC) and input/output (I/O) circuits, for example.

The circuit substrate 12 includes a cutout portion 16 arranged to engage the active circuit component 14. In the example shown in FIG. 1, the cutout portion 16 is defined along an exterior perimeter edge 18 of the circuit substrate 12. The cutout portion 16 includes an interior perimeter edge 20. The interior perimeter edge 20 includes a first edge 22 and a second edge 24 opposite the first edge 22. The circuit substrate 12 further includes an upper surface 26 and a lower surface 28. Although only one cutout portion 16 is shown, the circuit substrate 12 may include multiple cutout portions 16 to accommodate multiple active circuit components 14. In addition, the circuit substrate 12 may include a single cutout portion 16 having dimensions to accommodate multiple active circuit components 14. Further, although the cutout portion 16 is shown as a rectangular shape, the cutout portion 16 may be of varying shapes and may be defined at various positions of the circuit substrate 12.

The active circuit component 14 is disposed within the cutout portion 16 and off of the circuit substrate 12. That is, the body of the active circuit component 14 is not mounted on the upper surface 26 of the circuit substrate 12, but rather mounted in the cutout pattern 16. For the sake of clarity and explanation, various surfaces of the circuit substrate 12 and of the active circuit component 14 will be referred to herein as upper and lower surfaces. However, this terminology is merely for the sake of distinguishing each surface and their relationship to one another, and is not intended to necessarily be descriptive of the orientation of the circuit package 10 and should not be construed as a limitation on the scope of the claims.

The active circuit component 14 includes a lead frame 30 and an optoelectronic module 32 disposed on the lead frame 30. The optoelectronic module 32 may be an optical circuit, such as an optical receiver, an optical transmitter, an optical transceiver, an optical transponder, a small form-factor optoelectronic device, a pluggable optoelectronic device, a multi-source agreement (MSA) compliant optoelectronic device, an optical subassembly, or the like. Although described as including an optoelectronic module 32, such as an optical receiver or transmitter, the optoelectronic module 32 may be replaced with an electrical module, such as an integrated circuit (IC), logic circuit, or the like. Thus, although disclosed as an optoelectronic device, the active circuit component 14 may be an active electrical device.

Figure 4:
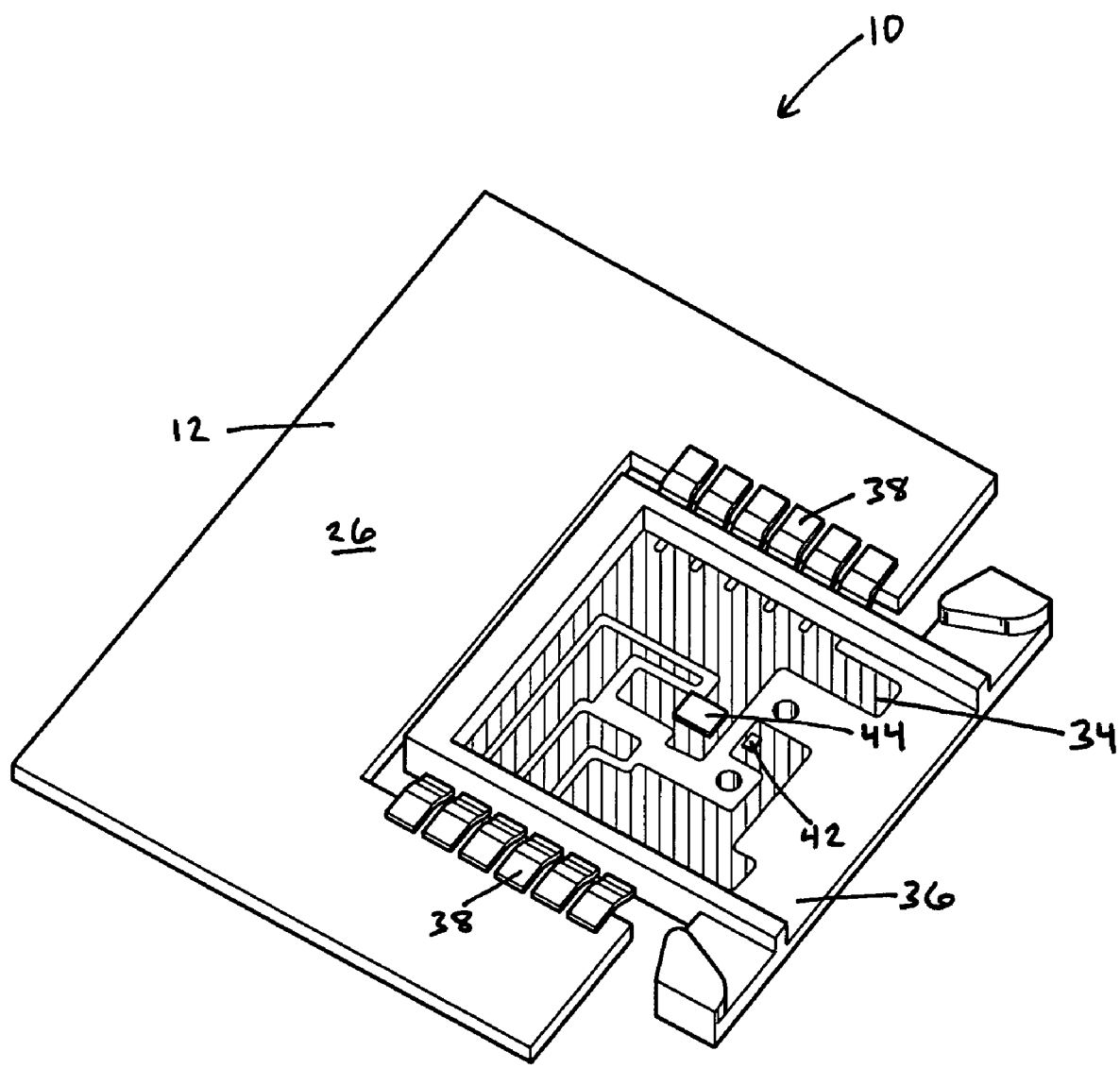
FIG. 4 is a top perspective view of the circuit package depicting a lead frame, an electrical component and an optical component of the active circuit component.
Figure 5:
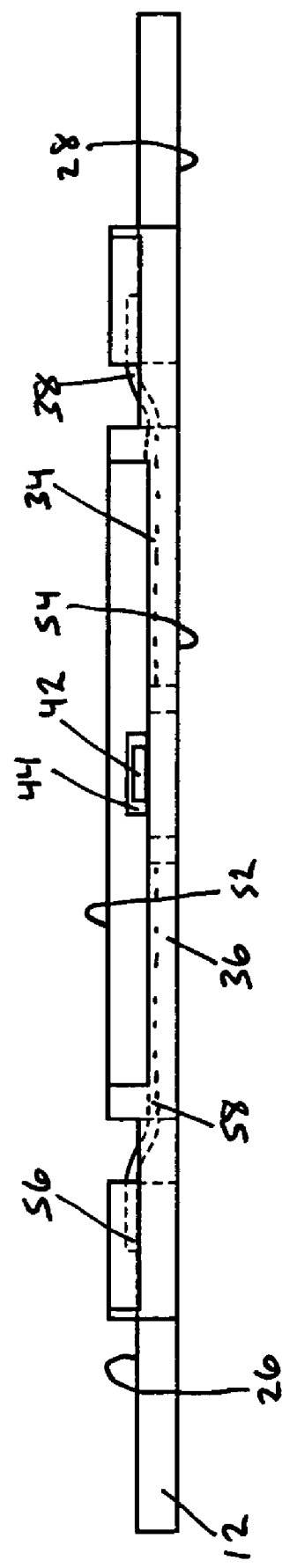
FIG. 5 is a side view of the circuit package of FIG. 4.

Referring to FIGS. 4 and 5, the lead frame 30 is a molded lead frame which includes an interconnect 34 disposed on or embedded in a lead frame substrate 36. In particular, the interconnect 34 is an electrical lead frame formed into a wiring pattern. The electrical lead frame 34 operatively couples the components of the optoelectronic module 32, and further operatively couples the active circuit component 14 with the circuit substrate 12 via one or more electrical leads 38. The lead frame substrate 36 includes an enclosure to mount the optoelectronic module 32, and further includes optics connectors 40. The optics connectors 40 may receive spring-biased hooked portions of an optical connector. The optical connector may house one end of an optical interconnect, such as a fiber optic. The optical interconnect may be optically coupled to the optoelectronic module 32. In one example, the optical interconnect is a fiber optic which may be a plastic fiber optic. The optics connectors 40 may assist to secure and optically couple the optical interconnect with the circuit package 10.

As shown in FIGS. 4 and 5, the optoelectronic module 32 includes an optical component 42 operatively coupled to an electrical component 44 via the electrical lead frame 34. In one example, the optical component 42 may be a receiving optical component, such as a receiver positive-intrinsic-negative (PIN) diode, and the electrical component 44 may be an amplifier such as a transimpedance amplifier (TIA) operatively coupled to the receiver PIN diode. In another example, the optical component 42 may be a transmitting optical component, such as a vertical cavity surface emitting laser (VCSEL) or another diode laser, and the electrical component 44 may be a diode laser driver operatively coupled to the optical transmitter. Although only one optical component 42 and one electrical component 44 are shown, the optoelectronic module 32 may include multiple optical components 42 and/or multiple electrical components 44. For example, the optoelectronic module 32 may further include a re-timer operatively coupled to a diode laser driver. The optoelectronic module 32 may also include a clock and data recovery (CDR) unit and/or a serializer/deserializer (SERDES) operatively coupled to an amplifier. In one example, the optoelectronic module 32 is an optical transceiver, which may include both a receiving optical component and a transmitting optical component, along with one or more of the above-disclosed electrical components 44.

Referring again to FIG. 1, a protective shell or case 46 may be disposed on the lead frame 30 over the optical component 42 and the electrical component 44. In one example, the protective case 46 may be a plastic case. An optical lens 48 may be provided in the protective case 46 and is optically coupled to the optical component 42. The protective case 46 may further include male alignment posts 50. The male alignment posts 50 may engage corresponding female openings of the optical connector described above. The alignment posts 50 may thereby assist in aligning and optically coupling the optical interconnect with the optical lens 48.

Figure 3:
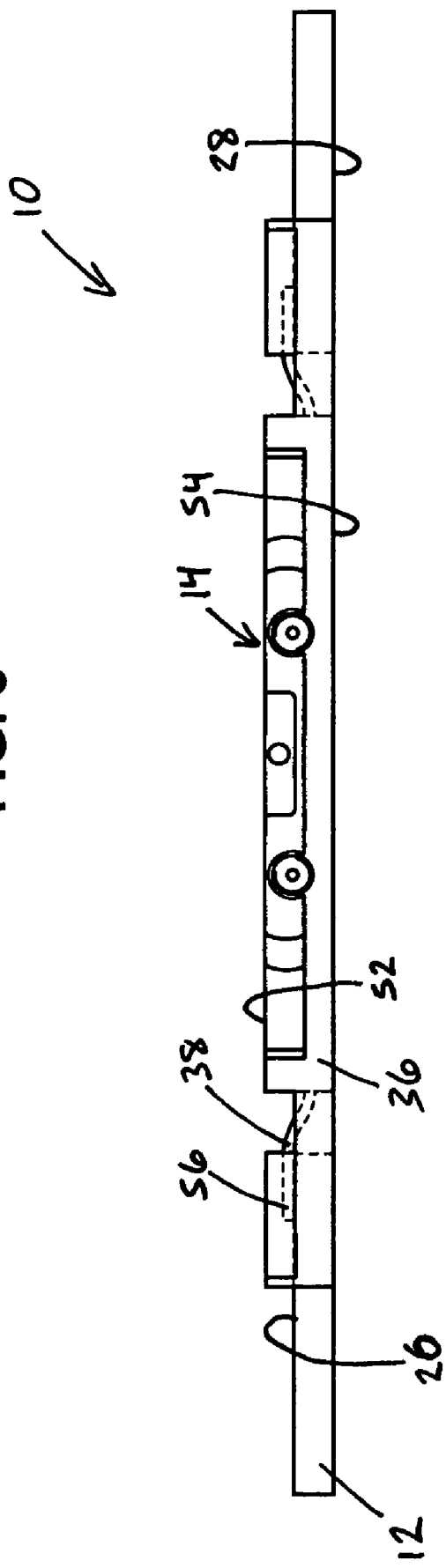
FIG. 3 is a side view of the circuit package of FIG. 1.

The active circuit component 14 further includes an upper surface 52 and a lower surface 54. The electrical lead frame 34, and, in particular, each electrical lead 38, is bent to form a first lead portion 56 and a second lead portion 58 electrically connected to the first lead portion 56. The second lead portion 58 extends out from the side of the lead frame substrate 36 at the same level as the wiring pattern of the electrical lead frame 34. The bend causes the second lead portion 58 to be positioned at level that is lower than the first lead portion 56 and lower than the upper surface 26 of the circuit substrate 12. As shown in FIG. 3, a lower surface of the first lead portion 56 is in electrical contact with the upper surface 26 of the circuit substrate 12. In particular, the first lead portion 56 may electrically contact an electrically conductive trace exposed on the upper surface 26 of the circuit substrate 12 thereby providing an electrical connection between the electrical lead frame 34 and the circuit substrate 12. The optical component 42 and the electrical component 44 are disposed on the upper surface of the second lead portion 58 and thereby operatively coupled to the lead frame 30 and the circuit substitute 12. Although the circuit package 10 is shown to electrically connect the electrical leads 38 proximate the first edge 22 and the second edge 24, the electrical lead frame 34 may include electrical leads 38 anywhere along the interior perimeter edge 20.

Figure 2:
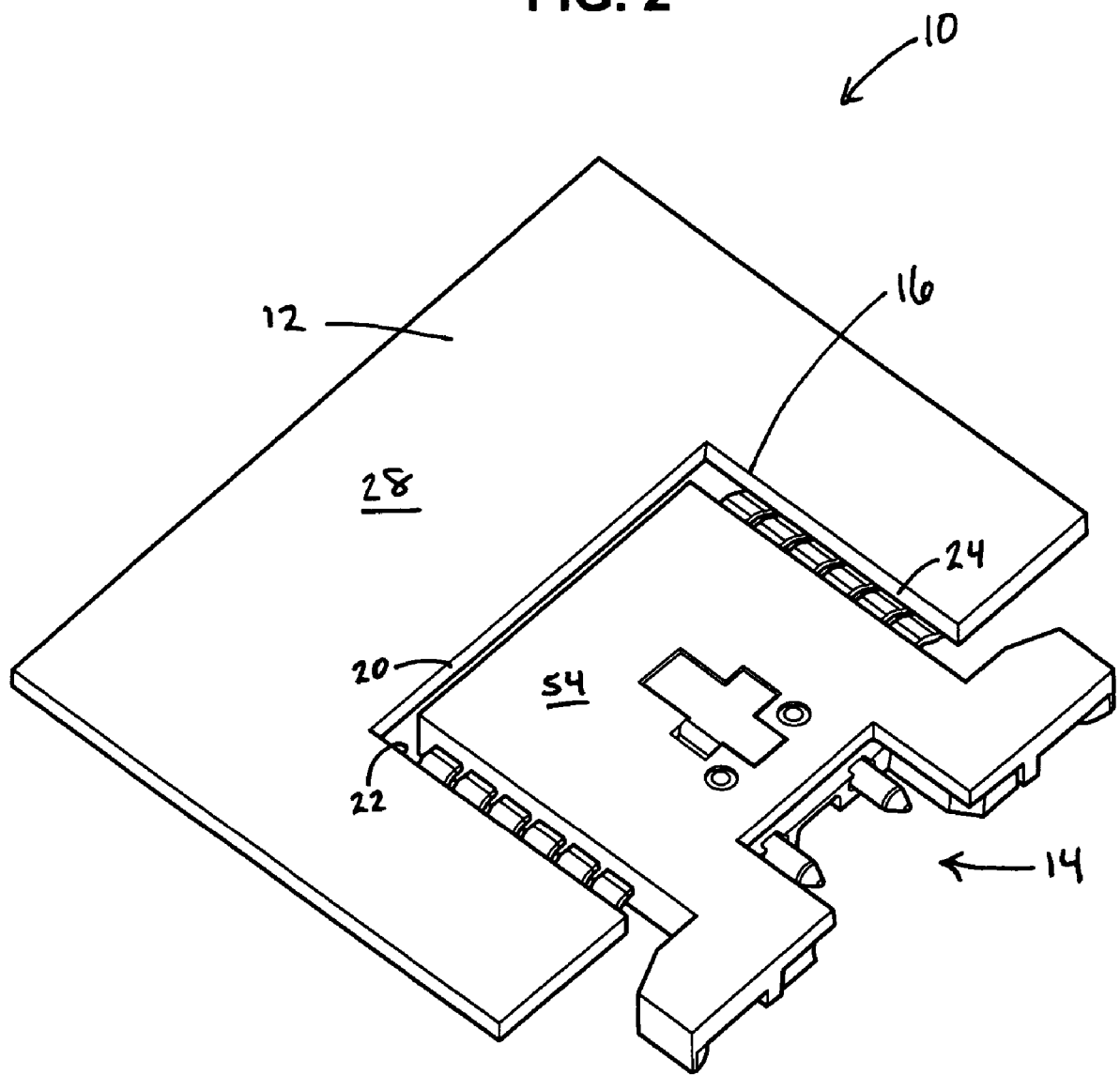
FIG. 2 is a bottom perspective view of the circuit package of FIG. 1.

As shown in FIGS. 2 and 3, the active circuit component 14 is disposed within the cutout portion 16 of the circuit substrate 12, such that the lower surface 54 of the active circuit component 14 is flush with the lower surface 28 of the circuit substrate 12. Alternatively, the active circuit component 14 may be disposed in the cutout portion 16 at various levels as compared to the circuit substrate 12, which may be accomplished by varying the structure of the electrical lead frame 34, and, in particular, varying the bend in the electrical leads 38. As disclosed, the profile of the circuit package 10 may be reduced by approximately the thickness of the circuit substrate 12 as compared to mounting an active circuit component on the surface of the circuit substrate 12. In one example, the active circuit component 14 protrudes approximately one millimeter above the upper surface of the circuit substrate 12.

Figure 6:
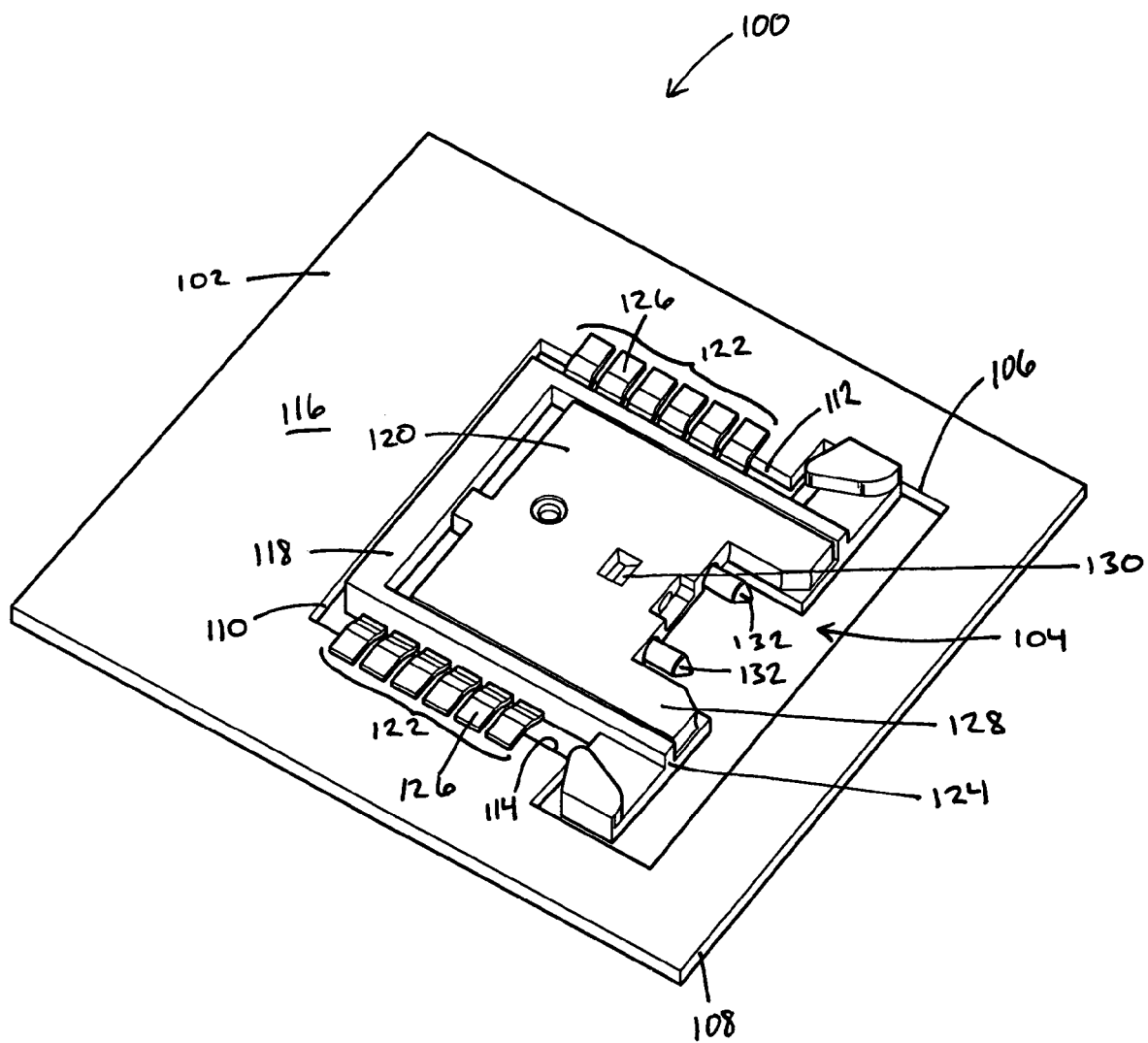
FIG. 6 is a top perspective view of an alternative example of a circuit package including an active circuit component mounted in a cutout of a circuit substrate.

As shown in FIG. 6, a second example of a circuit package 100 includes a circuit substrate 102 and an active circuit component 104. The circuit substrate 102 may be similar to the circuit substrate 12. In particular, the circuit substrate 102 includes a cutout portion 106 arrange to engage the active circuit component 104. However, instead of being defined along an exterior perimeter of the circuit substrate 102, the cutout portion 106 is defined within an exterior perimeter edge 108 of the circuit substrate 102. The cutout portion 106 includes an interior perimeter edge 110. The interior perimeter edge 110 includes a first edge 112, and a second edge 114 opposite the first edge 112. The circuit substrate 102 further includes an upper surface 116 and a lower surface (not shown). As with the cutout portion 16 above, the cutout portion 106 may vary in number, size, and position.

The active circuit component 104 may be similar to the active circuit component 14 above. In particular, the active circuit component 104 is disposed within the cutout portion 106. The active circuit component 104 may further include a lead frame 118, and an optoelectronic module 120 disposed on the lead frame 118. The optoelectronic module 120 may include an optical receiver, an optical transmitter, an optical transceiver, an optical transponder, pluggable optics, a multi-source agreement compliant optoelectronic device, or an optical subassembly, for example. Alternatively, an electronic module, such as an integrated circuit or logic circuit, may be substituted for the optoelectronic module 120.

As with the lead frame 30, the lead frame 118 may be a molded lead frame with a electrical lead frame interconnect 122 disposed on or embedded in a lead frame substrate 124. The electrical lead frame 122 is similar to the electrical lead frame 34 disclosed above. That is, the electrical lead frame 122 may be bent to form a first lead portion at a first level and a second lead portion at a second level electrically coupled to the first lead portion. The bend causes the second lead portion to be positioned lower than the upper surface 116 of the circuit substrate 102, and the first lead portion electrically contacts the circuit substrate 102. Thus, the active circuit component 104 may be disposed in the cutout portion 106, such that a lower surface of the active circuit component 104 may be flush with the lower surface of the circuit substrate.

Although not shown in FIG. 6, the electrical lead frame 122 includes a wiring pattern, which may be disposed at the second level. The optoelectronic module 120 may include optical and electrical components (not shown) which may be disposed on the wiring pattern, thereby inter-coupling the optical and electrical components. The optical components may include receiving optical components and/or transmitting optical components, and the electrical components may include amplifiers, diode laser drivers, re-timers, clock and data recover units or serialer/deserializers, for example. The electrical lead frame 122 further includes one or more electrical leads 126 which operatively couple the active circuit component 104 with the circuit substrate 102. In particular, the electrical leads 126 may be in electrical contact with electrically conductive signal traces disposed on or embedded in the circuit substrate 102.

A protective case 128 may be disposed on the lead frame 118, and over the optical components and the electrical components. The protective case 128 may include an optical lens 130 utilized to optically couple an optical interconnect, such as a plastic optical fiber, with the optical component. The protective case 128 may further include male alignment posts 132 which may engage with corresponding female openings in an optical connector to optically couple the optical interconnect with the lens 130. The lead frame substrate 124 may include optics connectors 132 to receive spring biased hooked portions of the optical connector, and secure the optical connector to the active circuit component 104.

The mounting techniques may thereby be utilized with a variety of components, including those that may be mounted away from the exterior perimeter edge 108 of the circuit substrate 102. The overall profile of the circuit package 100 may thereby be reduced as compared with mounting the components on the surface of the circuit substrate 102.

Figure 7:
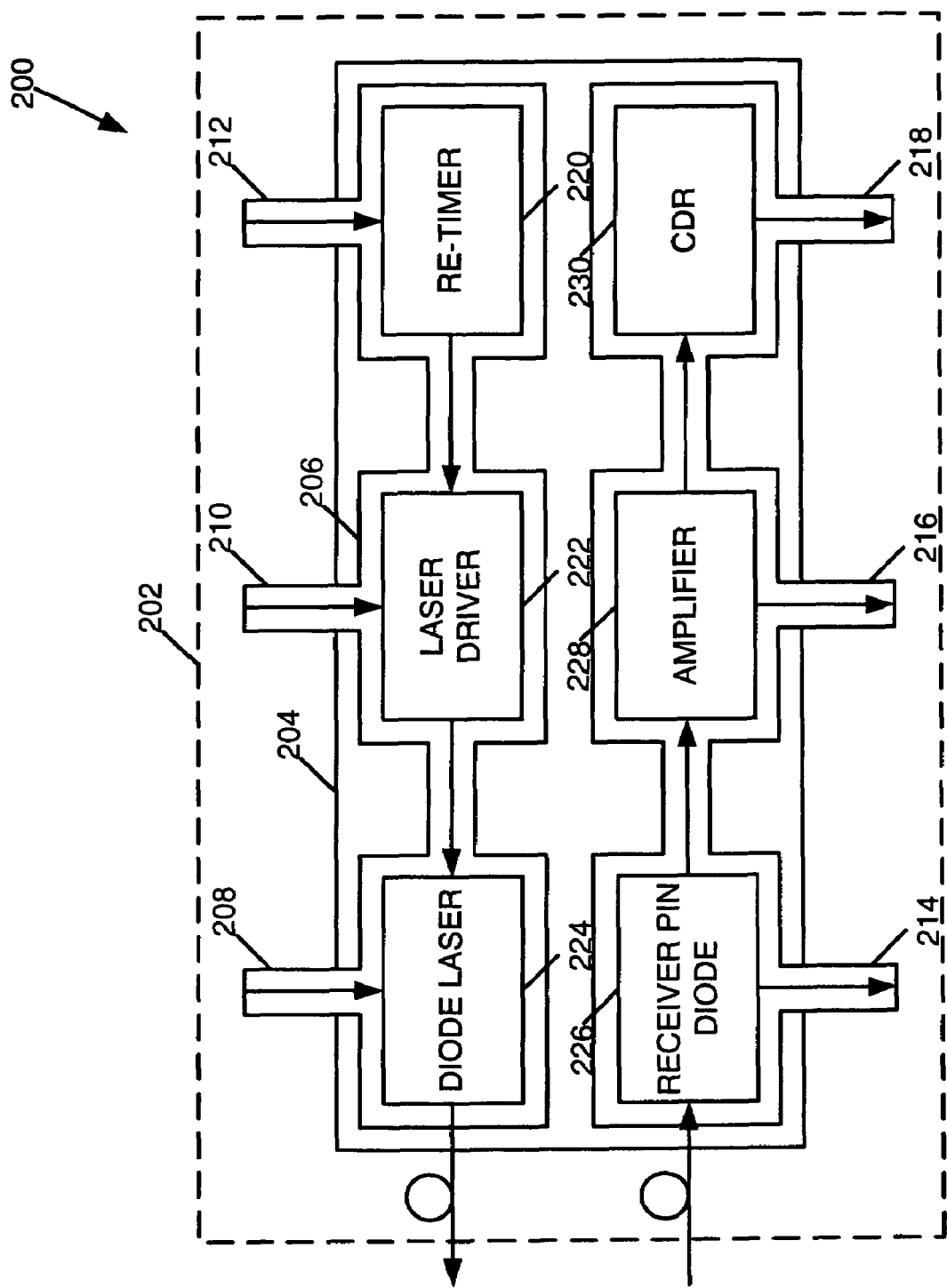
FIG. 7 is a block diagram of an example of an optical transceiver which may be included as the active circuit component in the circuit package of FIGS. 1-6.

FIG. 7 is a block diagram of an example of an optical transceiver 200 which may be the active circuit component 14 shown schematically in FIGS. 1-5, or the active circuit component 104 shown schematically in FIG. 6. In one example, the optical transceiver 200 may be a pluggable optical transceiver, including a small form-factor pluggable optical transceiver. However, as disclosed above, the active circuit component may be other optical circuits such as optical receivers and optical transmitters. Referring to FIG. 7, the optical transceiver 200 includes a lead frame 202, such as the lead frames 30, 118 disclosed above. The optical transceiver 200 may include various small form-factor electrical components, such as a re-timer, a diode laser driver, a clock and data recovery unit, a serializer/deserializer and an amplifier, for example. In addition, the optical transceiver 200 may include various optical components, such as a transmitting optical component and a receiving optical component, for example.

Each of the electrical components and the optical components may be mounted on the lead frame 202, which may be a molded lead frame. As with the lead frames 30, 118 above, the lead frame 202 may include a lead frame substrate 204 and an electrical lead frame 206 disposed on or in the lead frame substrate 204. Some or all of the optical components and the electrical components may be mounted on, and electrically coupled to, the electrical lead frame 204.

The electrical lead frame 206 may include one or more electrical leads 208, 210, 212, 214, 216, 218 to provide an interface with a printed circuit board when the transceiver 200 is mounted in a cutout of the printed circuit board. Each of the electrical leads 208, 210, 212, 214, 216, 218 may be the electrical leads 38, 126 disclosed above. That is, each of the electrical leads 208, 210, 212, 214, 216, 218 may include a first portion that electrically connects with electrically conductive traces on an upper surface of a PCB, whereas a second portion may be provided at a level lower than the first portion and electrically connect with the optical components and electrical components of the optical transceiver 200. As such, the optical transceiver 200 may be disposed in a cutout portion of a PCB, such that the bottom surface of the optical transceiver 200 is positioned lower than the upper surface of the PCB. Although FIG. 7 depicts that each of the optical components and electrical components are individually coupled to an electrical lead 208, 210, 212, 214, 216, 218, the number and placement of the electrical leads may be dependent on the circuit design and the electrical leads 208, 210, 212, 214, 216, 218 are shown in FIG. 7 for schematic representation and should not be construed as a limitation on the scope of the claims.

A re-timer 220 is mounted on, and electrically coupled to, the electrical lead frame 206, and is further operatively coupled to a laser driver 222 via the electrical lead frame 206. The laser driver 222 may also be mounted on the electrical lead frame 206. The laser driver 222 is operatively coupled to a diode laser 224 and utilized to drive the diode laser 224. The diode laser 224 may likewise be mounted on the electrical lead frame 206. Although a diode laser 224 is shown, other transmitting optical components may also be utilized.

A receiver positive-intrinsic-negative (PIN) diode 226 is also provided and may be mounted on the electrical lead frame 206. The receiver PIN diode 226 is operatively coupled to an amplifier 228 which may be mounted on the electrical lead frame 206. The amplifier 228 may be a transimpedance amplifier (TIA). The amplifier 228 is operatively coupled to a clock and data recovery (CDR) unit 230. The clock and data recovery unit may likewise be mounted on the electrical lead frame 206: The diode laser 224 and the receiver PIN diode 226 may respectively send and receive optical signals via one or more optical interconnects, such as optical fibers, optically coupled to the diode laser 224 and the receiver PIN diode 226. Although not shown, an optical lens, such as the optical lens 48, 128 disclosed above, may facilitate the optical coupling.

Figure 8:
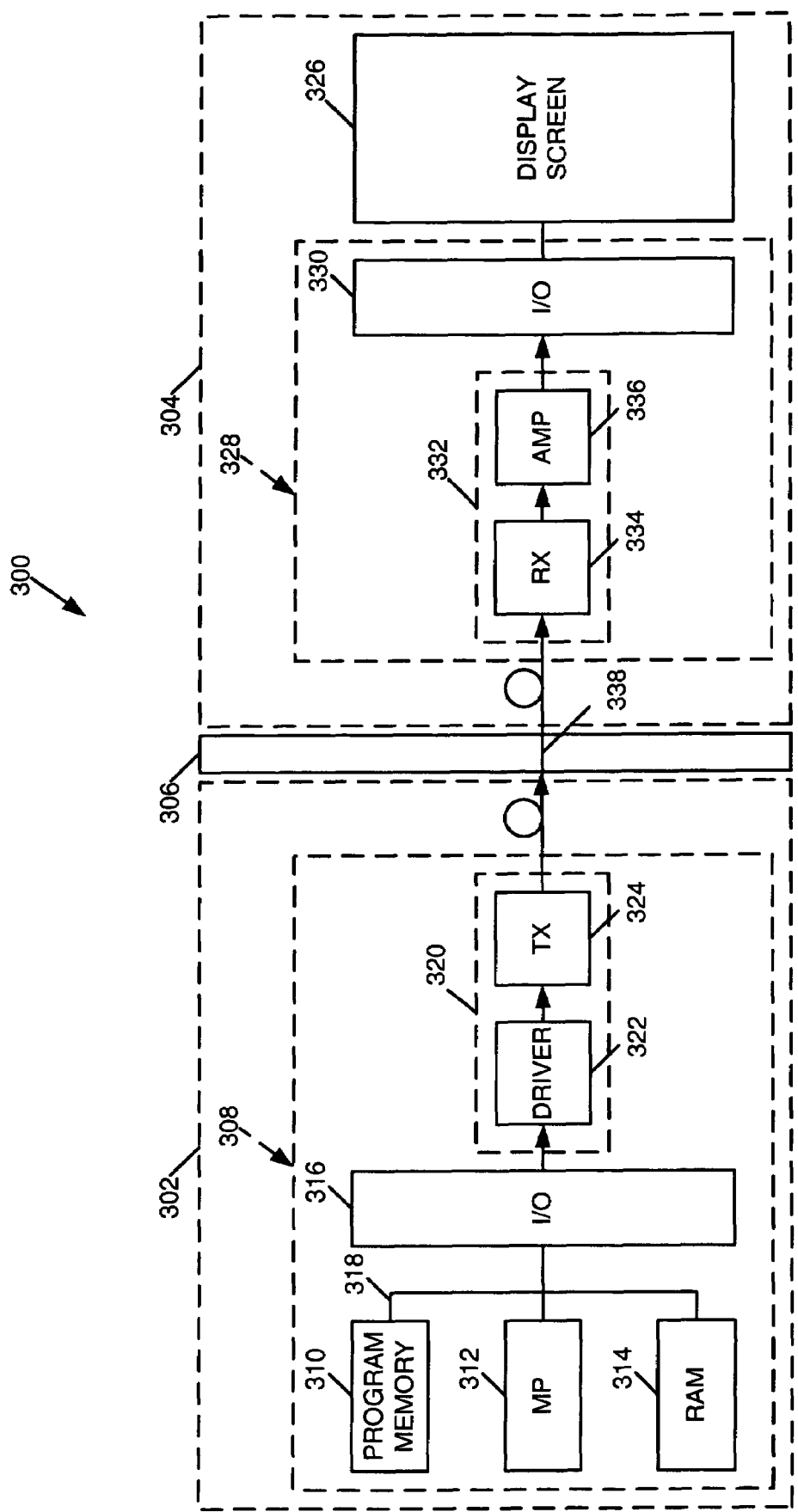
FIG. 8 is a block diagram of an example of a display system which may utilize the circuit package of FIGS. 1-6.

FIG. 8 is a block diagram of an example of a display system with the circuit package shown schematically in FIGS. 1-6. Although the display system 300 is disclosed as a display system that may be utilized in a laptop computer, the display system 300 may also be used for any device that utilizes display systems, and, in particular, low-profile display systems. Referring to FIG. 8, the display system 300 includes a base portion 302 and a display unit 304 articulately coupled to the base portion 302 via a hinge 306 or other articulated joint that holds the base portion 302 and the display unit 304 together, but allows each to swing relative to the other. Although the hinge 306 may be a pin and channel hinge assembly, various other hinges or articulated joints may likewise be used. In another example, the display system 300 may combine the base portion 302 and the display unit 304 into a single, low-profile unit, and omit the articulated joint.

The base portion 302 includes a display controller 308, which may be a graphics accelerator card or other graphics card. The base portion 302 may further include a central controller (not shown) for providing display instructions to the display controller 308. The display controller 308 includes a program memory 310, a microcontroller or microprocessor (MP) 312, a random-access memory (RAM) 314 and an input/output (I/O) circuit 316, all of which may be interconnected via an address/data bus 318. Although only one microprocessor 312 is shown, the display controller 308 may include multiple microprocessors 312. Similarly, the memory of the display controller 308 may include multiple RAMs 314 and multiple program memories 310. Although the I/O circuit 316 is shown as a single block, the I/O circuit 316 may include a number of different types of I/O circuits. The RAM(s) 314 and program memories 310 may be implemented as semiconductor memories, magnetically readable memories, and/or optically readable memories, for example.

Although the program memory 310 is shown in FIG. 8 as a read-only memory (ROM) 310, the program memory of the display controller 308 may be a read/write or alterable memory, such as a hard disk. In the event a hard disk is used as a program memory, the address/data bus 318 shown schematically in FIG. 8 may comprise multiple address/data buses, which may be of different types, and there may be an I/O circuit disposed between the address/data buses.

The display controller 308 further includes an optical transmitter 320 operatively coupled to the I/O circuit 316. The display controller 308 may include a circuit substrate having a cutout portion, and the optical transmitter 320 may be disposed in the cutout portion and operatively connected to the circuit substrate as disclosed above with the circuit package examples 10, 100. Although each of the additional components 310, 312, 314, 316 of the display controller 308 may be mounted on a surface of the circuit substrate, the circuit substrate of the display controller 308 may include a larger cutout portion, and/or additional cutout portions, and some or all of the components 310, 312, 314, 316 may be disposed therein, similar to the optical transmitter 320.

As with the active circuit components 14, 104 disclosed above, the optical transmitter 320 may include a lead frame, which may be a molded lead frame, and which provides an interconnect with the circuit substrate via an electrical lead frame. The optical transmitter 320 includes a laser driver 322 operatively coupled to a transmitting optical component 324, such as a diode laser. The laser driver 322 and the transmitting optical component 324 may each be mounted on the electrical lead frame. Although not shown, the optical transmitter 320 may also include a re-timer mounted on the electrical lead frame and operatively coupled to the I/O circuit 316 and the laser driver 322.

The display unit 304 includes a display screen 326 and a display driver 328 operatively coupled to the display screen 326. The display driver 328 may receive data relating to an image and cause the display screen 326 to display the image. The display screen 326 may be a flat-panel display screen, such as a liquid crystal display (LCD), a plasma display panel (PDP), a liquid crystal display (LCD), a liquid crystal on silicon (LCOS) display, a light emitting diode (LED) display, a ferroelectric LCD display, a field emissions display (FED), an electroluminescent display (ELD), a front projection display, a rear projection display, and a microelectromechanical device (MEM) display such as a digital micromirror device (DMD) display or a grating light valves (GLV) display, etc. The display screen 328 may further include organic display technologies such as an organic electroluminescent (OEL) display and an organic light emitting diode (OLED) display, as well as a light emitting polymer display.

The display driver 326 includes an input/output (I/O) circuit 330 and an optical receiver 332 operatively coupled to the I/O circuit 330. Each pixel element of the display screen 326 (and the sub-pixel elements thereof) may be operatively coupled to the I/O circuit 330. Although not depicted, the display driver 328 may include a gate driver and a source driver operatively coupled to each pixel element.

The optical receiver 332 may include a circuit substrate having a cutout portion, and the optical receiver 332 may be disposed in the cutout portion and operatively connected to the circuit substrate as disclosed above with the circuit package examples 10, 100. Although any component of the display driver 328, including the I/O circuit 330, may be mounted on a surface of the circuit substrate, any component of the display driver 328 may be disposed in one or more cutout portions, similar to the optical receiver 332.

As with the active circuit components 14, 104 disclosed above, the optical receiver 332 may include a lead frame, which may be a molded lead frame, and which provides an interconnect with the circuit substrate of the display driver 328 via an electrical lead frame. The optical receiver 332 includes a receiving optical component 334, such as a receiver PIN diode, operatively coupled to an amplifier 336, such as a transimpedance amplifier. The receiving optical component 334 and the amplifier 336 may each be mounted on the electrical lead frame. Although not shown, the optical receiver 332 may also include a clock and data recover unit mounted on the electrical lead frame and operatively coupled to the I/O circuit 330 and the amplifier 336.

The display controller 308 and the display driver 328 may be operatively coupled via an optical interconnect 338. In one example, the optical interconnect 338 is a fiber optic, and, more particularly, may be a plastic fiber optic. The optical interconnect 338 is operatively coupled to the optical transmitter 320 and the optical receiver 332. Optical signals relating to image data are generated by the display controller and transmitted by the optical transmitter 308 through the optical interconnect 338. The optical signals are received by the optical receiver 332, and the display driver 328 causes the display screen 326 to display the image by manipulating the pixels (or subpixels) of the display screen 326 according to the image data.

Utilizing the circuit packages as disclosed above in the display system 300, allows the display controller 308 and the display driver 328 to have a low profile where the optical transmitter 320 and the optical receiver 332 are coupled to the circuit substrate, respectively, which may assist in the design and placement of components in the base portion 302 and the display 304 unit, respectively. Further, most or all of the components of the display controller 308 and the display driver 328 may be coupled to their circuit substrate in a similar manner, thereby lowering the overall profile of the display controller 308 and/or the display driver 328. In turn, the base portion 302 and/or the display unit 304 may have lower overall profiles. Although the display system 300 is disclosed as including an optical transmitter 320 in the base portion 302 and an optical receiver 332 in the display unit 304, optical transceivers, as disclosed above, may be utilized instead, thereby allowing for two-way communications between the display controller 308 and the display driver 328, such as with a touch screen display system.

Although certain apparatus constructed in accordance with the teachings of the invention have been described herein, the scope of the invention is not limited thereto. On the contrary, the invention includes all embodiments of the teachings of the invention fairly falling within the scope of the appended claims either literally or under the doctrine of equivalents.

What is claimed is:

1. A circuit package comprising:
    a circuit substrate having a cutout portion defined therein; and
    an active circuit component disposed off the circuit substrate within the cutout portion and including an interconnect electrically coupled to the circuit substrate, an upper surface and a lower surface, wherein the active circuit component is supported within the cutout portion without support provided to either the upper or lower surface.

2. The circuit package of claim 1, wherein the cutout portion comprises a cutout portion defined along an exterior perimeter edge of the circuit substrate.

3. The circuit package of claim 1, wherein the cutout portion comprises a cutout portion defined within an exterior perimeter edge of the circuit substrate.

4. The circuit package of claim 1,
    wherein the cutout portion comprises a first edge and a second edge opposing the first edge,
    wherein the interconnect is electrically connected to the circuit substrate at a position located proximate to at least one of the following: the first edge or the second edge.

5. The circuit package of claim 1, wherein the interconnect comprises one or more electrical leads electrically connected to the circuit substrate.

6. The circuit package of claim 5, wherein at least one of the one or more electrical leads comprises:
    a first lead portion at a first level electrically connected to an upper surface of the circuit substrate; and
    a second lead portion electrically connected to the first lead portion at a second level below the upper surface of the circuit substrate ad electrically connected to the active circuit component.

7. The circuit package of claim 5,
    wherein the circuit substrate comprises one or more electrically conductive traces having a exposed surface; and
    a surface of at least one of the one or more electrical leads electrically contacts the exposed surface of at least one of the electrically conductive traces.

8. The circuit package of claim 1, wherein the active circuit component comprises a molded lead frame having a lead frame substrate ad the interconnect is embedded in the molded lead frame.

9. The circuit package of claim 1,
    wherein the circuit substrate comprises a first surface and a opposing second surface; and
    wherein the active circuit component comprises a first surface flush with the first surface of the circuit substrate.

10. The circuit package of claim 1, wherein the circuit substrate comprises a printed circuit board.

11. The circuit package of claim 1, wherein the active circuit component comprises one of the following an electrical component, a optical-electrical component, a pluggable optical-electrical component, an optical receiver, an optical transmitter or a optical transceiver.

12. A display driver comprising the circuit package of claim 1.

13. A display controller comprising the circuit package of claim 1.

14. The circuit package of claim 1, wherein the interconnect comprises one or more electrical leads electrically connected to the circuit substrate, wherein the electrical leads support the active circuit component within the cutout.

15. The circuit package of claim 1, what the active circuit component is self-supporting within the cutout.

* * * * *